United States Patent
Tang et al.

(10) Patent No.: US 11,789,221 B2
(45) Date of Patent: Oct. 17, 2023

(54) TECHNIQUES FOR DEVICE COOLING IN AN OPTICAL SUB-ASSEMBLY

(71) Applicant: AEVA, INC., Mountain View, CA (US)

(72) Inventors: Zhizhong Tang, San Carlos, CA (US); Wenjing Liang, San Jose, CA (US); Kevin Kinichi Masuda, Alhambra, CA (US); Pradeep Srinivasan, Fremont, CA (US)

(73) Assignee: Aeva, Inc., Mountain View, CA (US)

( * ) Notice: Subject to any disclaimer, the term of this patent is extended or adjusted under 35 U.S.C. 154(b) by 1 day.

(21) Appl. No.: 17/494,415

(22) Filed: Oct. 5, 2021

(65) Prior Publication Data

US 2023/0103569 A1  Apr. 6, 2023

(51) Int. Cl.
*G02B 6/42* (2006.01)
*H01S 5/024* (2006.01)
*G02B 6/43* (2006.01)
*H01L 23/38* (2006.01)
*H01L 33/64* (2010.01)
*H10N 19/00* (2023.01)

(52) U.S. Cl.
CPC ............ *G02B 6/4271* (2013.01); *H01L 33/645* (2013.01); *H01S 5/02415* (2013.01); *G02B 6/43* (2013.01); *H01L 23/38* (2013.01); *H10N 19/00* (2023.02)

(58) Field of Classification Search
CPC ....... G02B 6/4271; G02B 6/4269; G02B 6/43; H01L 23/38; H01L 27/16; H01L 33/645; H01S 5/02415
See application file for complete search history.

(56) References Cited

U.S. PATENT DOCUMENTS

| | | | | |
|---|---|---|---|---|
| 5,602,860 | A * | 2/1997 | Masonson | H01S 5/02415 372/36 |
| 6,081,037 | A * | 6/2000 | Lee et al. | H01L 23/13 257/E21.511 |
| 6,252,726 | B1* | 6/2001 | Verdiell | H01S 5/02208 385/94 |
| 6,272,157 | B1* | 8/2001 | Broutin et al. | H01S 5/0687 372/27 |
| 7,298,941 | B2* | 11/2007 | Palen et al. | G02B 6/423 264/1.24 |
| 7,899,105 | B1* | 3/2011 | Hargis et al. | H01S 5/146 372/102 |
| 9,762,026 | B2* | 9/2017 | Tamura et al. | H01S 5/02255 |
| 10,181,694 | B2* | 1/2019 | Tamura et al. | H01S 5/02253 |
| 10,615,567 | B1* | 4/2020 | Gelhausen et al. | H04B 10/58 |
| 11,075,500 | B2* | 7/2021 | Arimoto et al. | H01S 5/18 |
| 2003/0072337 | A1* | 4/2003 | Miguelez et al. | H01S 5/02251 372/34 |

(Continued)

*Primary Examiner* — M. A. Golub-Miller
(74) *Attorney, Agent, or Firm* — Womble Bond Dickinson (US) LLP

(57) ABSTRACT

An optical sub-assembly includes a diode submount structure, a diode mounted to the diode submount, and a thermoelectric cooler (TEC). The TEC is in thermal contact with the diode, and the diode is positioned between the diode submount structure and the TEC.

18 Claims, 4 Drawing Sheets

(56) References Cited

U.S. PATENT DOCUMENTS

| | | | |
|---|---|---|---|
| 2005/0286580 A1* | 12/2005 | Oka | G11B 7/125 |
| 2011/0316024 A1* | 12/2011 | Hung et al. | H01L 33/486 |
| | | | 257/E33.056 |
| 2013/0250979 A1* | 9/2013 | Muendel et al. | G02F 1/353 |
| | | | 372/20 |
| 2014/0029639 A1* | 1/2014 | Zarbock et al. | G02B 6/4269 |
| | | | 372/50.1 |
| 2014/0042614 A1* | 2/2014 | Yu et al. | H01L 24/83 |
| | | | 257/E23.06 |
| 2014/0185312 A1* | 7/2014 | Louderback | H05K 1/0203 |
| | | | 362/555 |
| 2015/0023377 A1* | 1/2015 | Shastri et al. | H01S 5/005 |
| | | | 372/36 |
| 2015/0121683 A1* | 5/2015 | Pfnuer et al. | H01L 33/64 |
| | | | 29/428 |
| 2016/0013866 A1* | 1/2016 | Doerr | G02B 6/00 |
| | | | 398/139 |
| 2016/0247527 A1* | 8/2016 | Cheng et al. | G11B 5/314 |
| 2016/0285224 A1* | 9/2016 | Zhang et al. | H01S 5/06804 |
| 2017/0054269 A1* | 2/2017 | Tamura et al. | H01S 5/02255 |
| 2017/0194308 A1* | 7/2017 | Evans et al. | G02F 1/2255 |
| 2017/0261708 A1* | 9/2017 | Ding et al. | G02B 6/4246 |
| 2017/0331557 A1* | 11/2017 | Pfnuer et al. | H01L 33/52 |
| 2018/0102440 A1* | 4/2018 | Novack et al. | H01L 31/024 |
| 2018/0156972 A1* | 6/2018 | Kainuma et al. | H05K 1/183 |
| 2018/0180826 A1* | 6/2018 | Merget et al. | G02B 6/136 |
| 2018/0217343 A1* | 8/2018 | Matsumura et al. | G02B 6/428 |
| 2019/0028189 A1* | 1/2019 | Teranishi | G02B 6/4204 |
| 2019/0041576 A1* | 2/2019 | Byrd et al. | G02B 6/12002 |
| 2019/0190608 A1* | 6/2019 | Chitica et al. | H01S 5/0261 |
| 2019/0271819 A1* | 9/2019 | Meade et al. | H01L 23/36 |
| 2019/0302380 A1* | 10/2019 | Furuya et al. | H01L 31/02005 |
| 2019/0324222 A1* | 10/2019 | Kettler et al. | H04B 10/801 |
| 2019/0393121 A1* | 12/2019 | Swaminathan et al. | H01L 24/17 |
| 2020/0144790 A1* | 5/2020 | Nagarajan et al. | H01S 5/1021 |
| 2020/0194969 A1* | 6/2020 | Gelhausen et al. | G02B 6/4266 |
| 2020/0235161 A1* | 7/2020 | Kwak et al. | H01L 27/156 |
| 2020/0273783 A1* | 8/2020 | Sankman et al. | H01L 23/49861 |
| 2020/0280173 A1* | 9/2020 | Gao et al. | H01S 5/142 |
| 2021/0215895 A1* | 7/2021 | Kazama et al. | H05K 1/0209 |
| 2022/0061148 A1* | 2/2022 | Mentovich et al. | H01L 23/38 |
| 2022/0181289 A1* | 6/2022 | Goh et al. | H01L 24/17 |

* cited by examiner

TECHNIQUES FOR DEVICE COOLING IN AN OPTICAL SUB-ASSEMBLY

FIELD OF INVENTION

The present disclosure is related to optical sub-assemblies for diodes and packaging methods for such optical sub-assemblies.

BACKGROUND

A number of non-trivial challenges arise when designing and operating optical sub-assemblies for laser diodes. Heat generated by the laser diodes can decrease efficiency. In conventional optical sub-assemblies, a diode submount structure is mounted on a TEC device, and diodes are positioned on the submount. According to such designs, the TEC cools the laser diodes through the submount structure, and the diodes dissipate heat generally only in one direction through the submount structure and the TEC device. Therefore, a need exists for an optical sub-assembly that more effectively cools diode devices.

SUMMARY

The present disclosure describes various embodiments of optical sub-assemblies and methods that, among other things, increase cooling of laser diodes within such sub-assemblies.

According to one aspect, the present disclosure relates to an optical sub-assembly including a diode submount structure; a diode mounted to the diode submount; and a thermoelectric cooler (TEC) in thermal contact with the diode, wherein the diode is positioned between the diode submount structure and the TEC. In an embodiment, the diode submount structure is a silicon photonics (SiPho) die. In an embodiment, the SiPho die includes a waveguide, wherein light from the diode can exit the optical sub-assembly via the waveguide. In an embodiment, the SiPho die is positioned over the TEC and overhangs the TEC to prevent an underfill material from covering the waveguide. In an embodiment, the SiPho die overhangs the TEC by between 1-2 mm. In an embodiment, the underfill material is a thermally conductive and electrically insulating material. In an embodiment, the diode submount structure is an aluminum nitride sub-mount structure. In an embodiment, the TEC directly cools the diode mounted between the diode submount structure and the TEC. In an embodiment, the TEC includes a top surface facing away from a housing with electrical interconnects, and a bottom surface mounted to the housing, and the diode is directly connected to the top surface of the TEC. In an embodiment, the optical sub-assembly also includes one or more integrated circuits electrically connected to the diode submount structure. In an embodiment, the one or more integrated circuits are positioned between the diode submount structure and the TEC.

According to another aspect, the present disclosure relates to a method of cooling an optical sub-assembly including operating a diode mounted to the diode submount; and cooling the diode with a thermoelectric cooler (TEC) in thermal contact with the diode, wherein the diode is positioned between the diode submount structure and the TEC. In an embodiment, the diode submount structure is a silicon photonics (SiPho) die. In an embodiment, the SiPho die includes a waveguide, and light from the diode exits the SiPho die via the waveguide. In an embodiment, the SiPho die is positioned over the TEC and overhangs the TEC to prevent an underfill material from covering the waveguide. In an embodiment, the diode submount structure is an aluminum nitride sub-mount structure. In an embodiment, cooling the diodes includes directly cooling the diode mounted between the diode submount structure and the TEC. In an embodiment, the method also includes cooling one or more integrated circuits electrically connected to the diode submount structure.

According to another aspect, the present disclosure relates to a system for cooling diodes, including: a housing with electrical interconnects; a thermoelectric cooler (TEC) positioned on the housing; a silicon photonics (SiPho) die; and a number of diodes mounted to the SiPho die. Each of the diodes is positioned between the SiPho die and the TEC and in direct thermal communication with both the SiPho die and the TEC. In an embodiment, the system also includes one or more integrated circuits positioned between the SiPho die and the TEC and in direct thermal communication with both the SiPho die and the TEC.

BRIEF DESCRIPTION OF THE DRAWINGS

For a more complete understanding of the various examples, reference is now made to the following detailed description taken in connection with the accompanying drawings in which like identifiers correspond to like elements.

DETAILED DESCRIPTION

The present disclosure describes various examples of optical sub-assemblies and packaging methods for optical sub-assemblies. In some embodiments, the optical sub-assemblies disclosed herein have good thermal dissipation capabilities and deliver high optical power with low total electrical power consumption. The optical sub-assemblies disclosed include a diode submount structure, such as a silicon photonics (SiPho) die or ceramics substrate, and at least one laser or semiconductor optical amplifier (SOA) diode. Typically, the ceramics substrate is made of high thermal conductive materials such as aluminum nitride (AlN) with metallization on the surface for electrical connection. The optical sub-assemblies also include one or more thermoelectric coolers (TEC) or heat sink.

In one embodiment, a SiPho die used as a submount for the laser diodes can include at least one waveguide device to couple and transmit the light from the laser diode. One electrode of the laser diode can be bonded on the SiPho die, and the lasering light can be coupled into the waveguide in the SiPho die. Another electrode of the laser diode can be attached to the TEC such that the TEC can control the laser diode temperature. A thermally conductive epoxy underfill material or solder material (such as Sn—Au, Pb—Sn, Sn—Ag—Cu, Indium, etc. metal material or alloys) can be dispensed between the SiPho die and the TEC in order to further cool the laser temperature effectively and boost the optical power output. In some embodiments, any thermally conductive and electrically insulating material can be used, such as fillers, gel type pastes, phase change thermal interface materials, or a liquid phase material that is electrically insulating and thermally conductive. A liquid phase material could be held in place, for example, by the surface tension because of the small gaps between the silicon submount structure and the TEC device.

Figure 1:
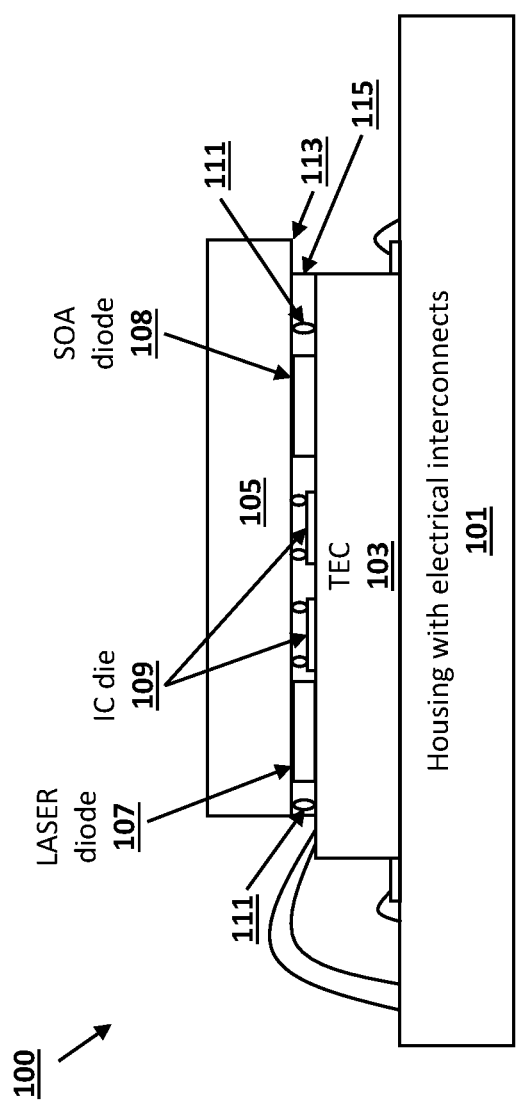
FIG. 1 illustrates an example optical sub-assembly according to embodiments of the present disclosure.

FIG. 1 illustrates an example optical sub-assembly 100 according to embodiments of the present disclosure. In this embodiment, the TEC 103 is positioned on a housing 101, and the diode submount structure 105, such as a SiPho die, is positioned such that one or more laser diode 107 and SOA diode 108 are sandwiched between the submount structure 105 and the TEC 103. This optical sub-assembly cools the laser diode 107 and SOA diode 108 more effectively, delivers higher optical power output, and consumes less total electrical energy. In the embodiment shown in FIG. 2, both the laser diode 107 and the SOA diode 108 are edge light emitting devices. In some embodiments, as shown in FIG. 1, one or more IC die 109 can also be positioned between the submount structure 105 and the TEC 103. In such cases, the TEC can also directly cool the IC die 109. Although only one TEC is shown in this embodiment, one skilled in the art will appreciate that multiple TECs can be implemented within the scope of the present disclosure.

In some embodiments, the submount structure 105 can include a SiPho die, or an AlN submount structure. An electrical circuit can be printed on the top of an AlN layer of the TEC cooling side. In another embodiment, the SiPho die has TSV structure inside the silicon, and IC die 109 can be on another side of the SiPho die.

The TEC 103 can include a top surface facing away from the housing 101 and a bottom surface that is mounted on or in contact with the housing 101. One or more electrical interconnects can be made between the TEC 103 and the housing 101, as shown in FIG. 1. The laser diodes 107 and SOA diode 108 can be formed on or in contact with the top surface of the TEC 103.

In an embodiment, the submount structure 105 includes a SiPho die, which also includes a waveguide. The waveguide can be used to guide light from the laser diode 107 and SOA diode 108 out of the optical sub-assembly 100. The SiPho die can be positioned over the TEC 103 to create an overhang 113, in order to prevent an underfill material 115 from covering the waveguide. As can be seen in FIG. 1, solder connections 111 can be used to connect the SiPho die with the TEC 103, and an underfill material 115 can fill the space between the SiPho die and the TEC 103. In some embodiments, the SiPho die can overhang the TEC by between 1-2 mm. The underfill material 115 can be a thermally conductive material in order to provide further cooling and heat dissipation for the SiPho die and the laser diode 107 and SOA diode 108.

In an embodiment, the laser diode 107 or SOA diode 108 could be p-side (anode) bonded on the Sipho die with SN—AU alloy or other soldering material, or thermally conductive paste like Ag-epoxy. The n-side (cathode) of the diodes could be bonded on the TEC top AlN ceramics using Sn—Au alloy or soldering material, or thermally conductive epoxy paste. In such an embodiment, the heat generated in the quantum well region of the diodes spreads in both directions - up to the Sipho die and also down to the AlN ceramics, which is the top of the TEC devices. Between the Sipho die 105 and the TEC 103, a thermally conductive paste or underfill epoxy material 115 can be dispensed to facilitate heat spread horizontally within the material 105 and vertically from the Sipho die to AlN ceramics on the TEC 103.

In an embodiment, the underfill material 115 could be a thermally conductive epoxy such as commercially available Masterbond two-part epoxy EP30TC, which has a thermal conductivity of about 2.8 W/k.m with aluminum nitride as the thermal conductive fillers. When diamond is used as the filler, the underfill material conductivity can be as high as 6W/k.m such as commercial YINCAE SMT 158D8 underfill. The typical underfill material 115 bond line thickness between the Sipho die and TEC 105 can be around 100 um or less, which is largely defined by the laser diode 107 and SOA diode 108 thickness, which is typically around 100 um or less. These dimensions are merely used as examples, and are not intended to limit the invention to a particular size range for components. Compared to conventional subassemblies, the techniques disclosed herein provide significantly improved thermal dissipation from the laser diode 107 and SOA diode 108 junction to the TEC 105 or the outside environment.

In some embodiments, the submount structure 105 also serves as a heat spreader or heat dissipater for the diodes 107, 108, along with the TEC 105. The heat generated in the laser quantum well, or junction, which is a hot spot and in a very small volume of the material, can spread out from the junction to the laser body and out to the submount. The TEC device 105 can include many pellets (e.g. BiTe diodes), in some embodiments, sandwiched between top and bottom ceramics (e.g. AlN). The top and bottom AlN ceramics in the TEC can also further spread out heat for more effective cooling by the TEC.

Figure 2:
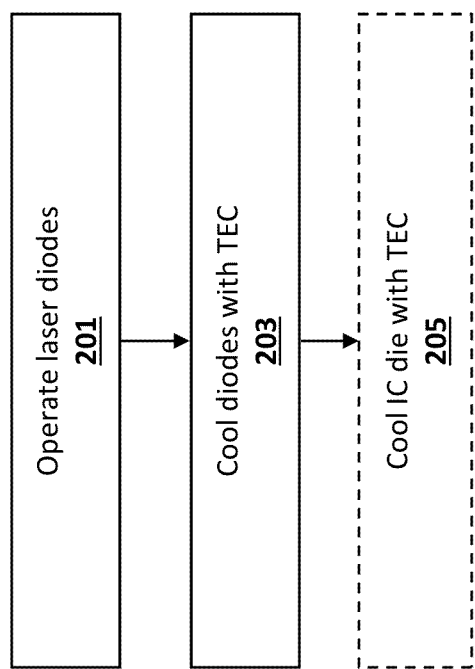
FIG. 2 is a flow diagram of an example method of cooling an optical sub-assembly, according to an embodiment of the present disclosure.

FIG. 2 is a flow diagram of an example method of cooling an optical sub-assembly, according to an embodiment of the present disclosure.

The method begins at operation 201 by operating the laser diode 107 and SOA diode 108. As discussed above, the diodes 107, 108 are positioned between a TEC 103 and a diode submount structure 105, such as an AlN submount structure or a SiPho die. In some embodiments, the submount structure 105 is a SiPho die that includes a waveguide, and the laser diode 107 and SOA diode 108 can emit light out of the SiPho die via the waveguide. In such embodiments, the SiPho die can overhang the TEC 103 by between 1-2 mm in order to prevent underfill material 115 from covering the waveguide.

The method continues at operation 203 with cooling the laser diode 107 and/or SOA diode 108 sandwiched between the submount material (AlN or silicon) and TEC top layer AlN. Compared to the prior art, the sandwiched packaging structure disclosed herein achieves lower thermal impedance (from the laser junction to TEC top AlN cold surface). The reduction in thermal impedance can be the result of heat spreading in more than one direction in the sandwiched structure — from the junction to the TEC AlN, as well as from the junction to the top submount. Additional cooling can be provided by the conductive underfill material between the submount and the TEC AlN cold side. The thermal performance difference is discussed in more detail in reference to FIGS. 4A-4B below.

In some embodiments, the method optionally continues at operation 205 with cooling one or more IC die 109 using the TEC 103. In some embodiments, the IC die 109 can also be positioned between the submount structure 105 and the TEC 103. In such cases, the TEC 103 can also directly cool the IC die 109.

Figure 3:
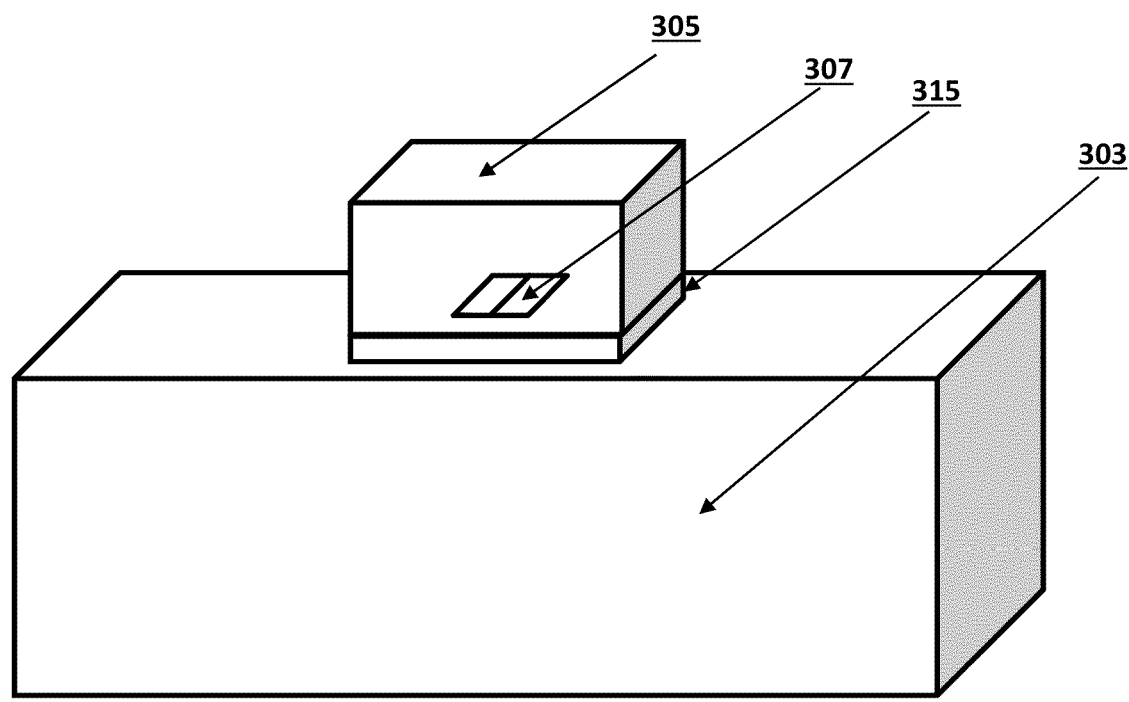
FIG. 3 is a three dimensional model of an example optical sub-assembly according to embodiments of the present disclosure.

FIG. 3 is a three dimensional model of an example optical sub-assembly according to embodiments of the present disclosure. In this embodiment, a laser 307 is sandwiched between a silicon die or submount structure 305 and a TEC device 303. A thermally conductive underfill material 315 is used to fill the space between the submount structure 305 and the TEC device 303, as well as improve heat dissipation. In the embodiment shown in FIG. 3, a common n-type InP substrate based InGaAsP edge emitting quantum well laser diode was used with dimensions of 400 um length, 250 um width, and 100 um thickness. This laser 307 can be attached on the silicon die 305 with p-side attached using Au—Sn solder alloy, and with the laser light coupled into the silicon waveguide with high positional tolerance (typically sub-micrometer in all x/y/z directions) for high coupling efficiency. A small volume of optically transparent and index matching epoxy may also be dispensed between the laser output and waveguide for further improving the light coupling efficiency. The TEC top AlN cold side can include dimensions of 3000×2000 um area, and 1000 um thickness, in this example embodiment. One skilled in the art will recognize that the TEC could be replaced by a heat sink in some embodiments, if the laser diode was passively cooled by thermal convection and radiation.

The laser 307 is sandwiched between the silicon die 305 and TEC 303 top AlN cold side. Accounting for the thickness of the laser 307, the 100 um height gap between silicon die 305 and TEC 303 top AlN was filled with thermally conductive underfill material 315. This material could be underfill type epoxy with thermally conductive but electrically insulating fillers, or gel type paste or phase change thermal interface materials.

Figure 4A:
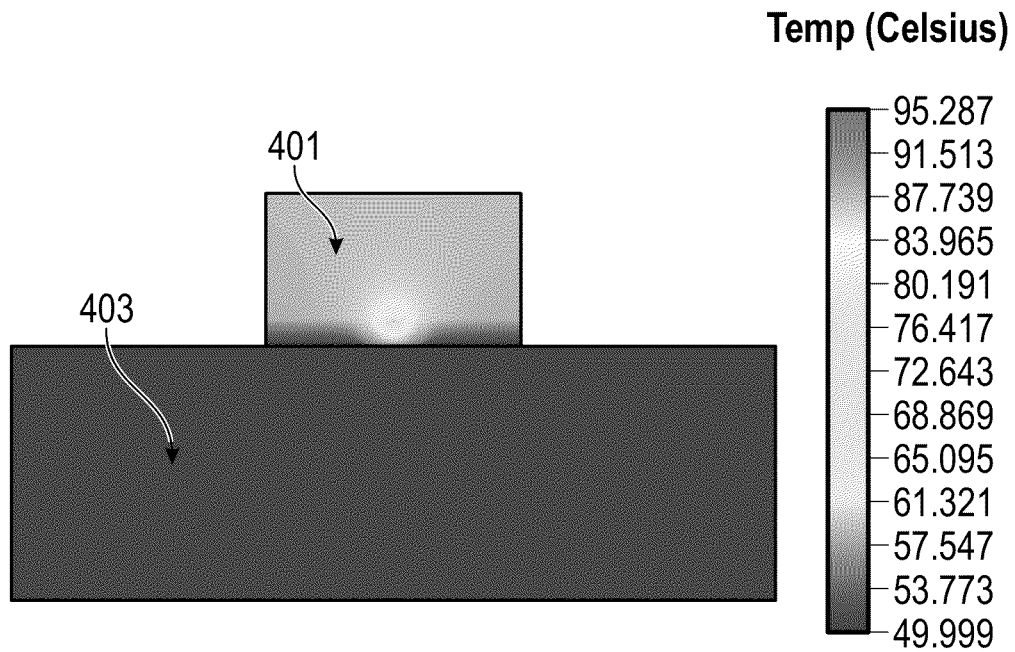
FIGS. 4A-4B show thermal field models of an example sub-assembly according to embodiments of the present disclosure compared to conventional techniques.
Figure 4B:
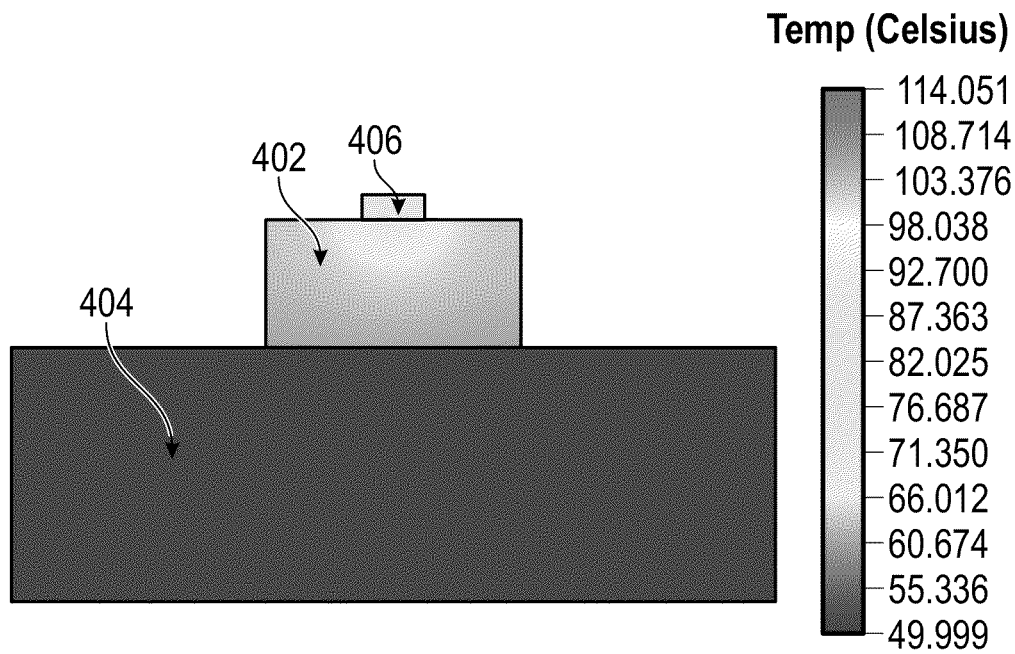

FIGS. 4A-4B show thermal field models of an example sub-assembly according to embodiments of the present disclosure compared to conventional techniques. FIG. 4A illustrates a thermal model of the design described in FIG. 3, where the laser is sandwiched between the silicon die 401 and the TEC device 403. In comparison, FIG. 4B illustrates a thermal model of a design where a laser 406 is mounted on a silicon die 402, which is then mounted on a TEC device 404.

In the thermal field modelling, for simplicity, the laser thermal heat generation during operation is assumed to be 1 Watt. All the heat was generated in the laser quantum well active junction region uniformly. The TEC top cold AlN was set at 50° C., and air temperature at 25° C. All the heat convection and radiation were set to normal conditions. The modelled FEM (Finite Element Modeling) thermal fields are shown in FIGS. 4A-4B. In the thermal FEM modeling, a gap filler material with thermal conductivity of 5 K/W.m was used for FIG. 4A.

Comparing the performance of the two designs, the laser junction active region temperature for the embodiments disclosed herein and shown in FIG. 4A is around 95° C. This is almost 20 degrees lower compared to the design in FIG. 4B, which had a laser junction active region temperature as high as around 114° C. In other words, the packaging techniques disclosed herein provide significantly improved cooling over alternative designs.

The preceding description sets forth numerous specific details such as examples of specific systems, components, methods, and so forth, in order to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary. Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example.

The term "coupled," along with its derivatives, is used to indicate that two or more elements interact with each other. These coupled elements may or may not be in direct physical or electrical contact with each other.

Although the operations of the methods herein are shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Furthermore, the terms "first," "second," "third," "fourth," etc. as used herein are meant as labels to distinguish among different elements and may not necessarily have an ordinal meaning according to their numerical designation.

What is claimed is:

1. An optical sub-assembly with efficient heat dissipation from the heat generating components, comprising:
    a housing comprising one or more electrical connections;
    a thermoelectric cooler (TEC) mounted to the housing and in electrical contact with the housing;
    a light emitting diode that emits an optical beam;
    a photonics die comprising a waveguide, wherein the optical beam emitted by the light emitting diode exits the optical sub-assembly via the waveguide;
    a thermally conductive underfill disposed between the photonics die and the TEC to facilitate heat transfer between the light emitting diode and the photonics die;
    wherein the TEC comprises a top surface and a bottom surface such that the bottom surface of the TEC is attached to the housing and the top surface of the TEC is attached to the light emitting diode;

wherein the photonics die is attached to the TEC, with the light emitting diode and the underfill interposed therebetween, such that a first surface of the light emitting diode is in direct contact with the TEC and a second surface of the light emitting diode opposite the first surface of the light emitting diode is in direct contact with the with photonics die; and wherein the photonics die is offset from the TEC in a horizontal direction, providing an overhang of the photonics die over the TEC, such that the underfill does not interfere with the optical beam exiting the waveguide.

2. The optical sub-assembly of claim 1, wherein the photonics die is a silicon photonics (SiPho) die.

3. The optical sub-assembly of claim 1, wherein the photonics die overhangs the TEC by between 1-2 mm.

4. The optical sub-assembly of claim 1, wherein the underfill is a thermally conductive and electrically insulating epoxy.

5. The optical sub-assembly of claim 1, wherein the light emitting diode is in direct thermal communication with both the photonics die and the TEC, and the TEC directly cools the light emitting diode.

6. The optical sub-assembly of claim 1, further comprising one or more integrated circuits electrically connected to the photonics die.

7. The optical sub-assembly of claim 6, wherein the one or more integrated circuits are disposed directly between the photonics die and the TEC.

8. The optical sub-assembly of claim 1, further comprising a semiconductor optical amplifier (SOA) disposed directly between the TEC and the photonics die.

9. The optical sub-assembly of claim 1, further comprising a plurality of light emitting diodes disposed directly between the TEC and the photonics die.

10. A method of cooling an optical sub-assembly comprising:

operating a light emitting diode of the optical sub-assembly to emit an optical beam, wherein the light emitting diode is attached to a photonics die, and wherein the optical beam emitted by the light emitting diode exits the optical sub-assembly via the waveguide;

cooling the light emitting diode with a thermoelectric cooler (TEC) in direct contact with the light emitting diode, wherein the TEC is mounted to a housing and is in electrical contact with the housing;

wherein a thermally conductive underfill disposed between the photonics die and the TEC to facilitate heat transfer between the light emitting diode and the photonics die;

wherein the TEC comprises a top surface and a bottom surface such that the bottom surface of the TEC is attached to the housing and the top surface of the TEC is attached to the light emitting diode;

wherein the photonics die is attached to the TEC, with the light emitting diode and the underfill interposed therebetween, such that a first surface of the light emitting diode is in direct contact with the TEC and a second surface of the light emitting diode opposite the first surface of the light emitting diode is in direct contact with the with photonics die; and wherein the photonics die is offset from the TEC in a horizontal direction, providing an overhang of the photonics die over the TEC, such that the underfill does not interfere with the optical beam exiting the waveguide.

11. The method of claim 10, wherein the photonics die is a silicon photonics (SiPho) die.

12. The method of claim 11, wherein the photonics die overhangs the TEC by between 1-2 mm.

13. The method of claim 12, wherein the underfill is a thermally conductive and electrically insulating epoxy.

14. The method of claim 10, wherein the optical sub-assembly further comprises one or more integrated circuits electrically connected to the photonics die.

15. The method of claim 14, further comprising:

cooling the one or more integrated circuits electrically connected to the photonics die via direct thermal communication with the photonics die and the TEC.

16. The method of claim 10, wherein cooling the light emitting diode comprises providing the light emitting diode in direct thermal communication with both the photonics die and the TEC, and the wherein TEC directly cools the light emitting diode.

17. A system for cooling diodes, comprising:

a housing comprising one or more electrical connections;

a thermoelectric cooler (TEC) mounted to the housing and in electrical contact with the housing;

a light emitting diode that emits an optical beam;

a photonics die comprising a waveguide, wherein the optical beam emitted by the light emitting diode exits the optical sub-assembly via the waveguide;

a thermally conductive underfill disposed between the photonics die and the TEC to facilitate heat transfer between the light emitting diode and the photonics die;

wherein the TEC comprises a top surface and a bottom surface such that the bottom surface of the TEC is attached to the housing and the top surface of the TEC is attached to the light emitting diode;

wherein the photonics die is attached to the TEC, with the light emitting diode and the underfill interposed therebetween, such that a first surface of the light emitting diode is in direct contact with the TEC and a second surface of the light emitting diode opposite the first surface of the light emitting diode is in direct contact with the with photonics die; and wherein the photonics die is offset from the TEC in a horizontal direction, providing an overhang of the photonics die over the TEC, such that the underfill does not interfere with the optical beam exiting the waveguide.

18. The system of claim 17, further comprising one or more integrated circuits positioned between the photonics die and the TEC and in direct thermal communication with both the photonics die and the TEC.

\* \* \* \* \*